(12) United States Patent
Otsuka et al.

(10) Patent No.: US 7,628,612 B2
(45) Date of Patent: Dec. 8, 2009

(54) HEAT TREATMENT APPARATUS, HEAT TREATMENT METHOD, AND COMPUTER READABLE STORAGE MEDIUM

(75) Inventors: Takahisa Otsuka, Koshi (JP); Tsuyoshi Shibata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 126 days.

(21) Appl. No.: 11/626,666

(22) Filed: Jan. 24, 2007

(65) Prior Publication Data

US 2007/0181557 A1 Aug. 9, 2007

(30) Foreign Application Priority Data

Feb. 9, 2006 (JP) .............................. 2006-032709

(51) Int. Cl.
 *F27B 9/04* (2006.01)
(52) U.S. Cl. ..................................... 432/247; 118/729
(58) Field of Classification Search ................ 432/247, 432/239, 243; 118/724, 725, 729; 427/240, 427/372.2, 299, 350; 414/217; 355/27, 30
See application file for complete search history.

(56) References Cited

U.S. PATENT DOCUMENTS

| | | | | |
|---|---|---|---|---|
| 5,202,716 A * | 4/1993 | Tateyama et al. | ........... | 396/624 |
| 6,024,502 A * | 2/2000 | Akimoto et al. | ............. | 396/579 |
| 6,168,667 B1 * | 1/2001 | Yoshioka | ..................... | 118/715 |
| 6,264,748 B1 * | 7/2001 | Kuriki et al. | ................. | 118/719 |
| 6,451,515 B2 * | 9/2002 | Takamori et al. | ............. | 430/330 |
| 6,467,976 B2 * | 10/2002 | Matsuyama et al. | .......... | 396/611 |
| 6,515,731 B1 * | 2/2003 | Akimoto | ....................... | 355/27 |
| 6,541,170 B2 * | 4/2003 | Fukuda et al. | ................. | 430/30 |
| 6,722,798 B2 * | 4/2004 | Senba et al. | ................. | 396/611 |
| 6,875,281 B2 * | 4/2005 | Kitano et al. | ................ | 118/719 |
| 6,884,298 B2 * | 4/2005 | Kitano et al. | ................ | 118/719 |
| 7,060,115 B2 * | 6/2006 | Hashiguchi et al. | ......... | 29/25.03 |
| 2005/0048421 A1 * | 3/2005 | Kitano et al. | ................ | 430/434 |
| 2008/0020315 A1 * | 1/2008 | Higashi et al. | ................ | 430/97 |

FOREIGN PATENT DOCUMENTS

JP 2001-85323 3/2001

* cited by examiner

*Primary Examiner*—Gregory A Wilson
(74) *Attorney, Agent, or Firm*—Oblon, Spivak, McClelland, Maier & Neustadt, P.C.

(57) ABSTRACT

In the present invention, a plurality of heat treatment units are arranged side by side in a linear form and a substrate transfer mechanism for transferring the substrate between the heat treatment units is provided in a heat treatment apparatus. The substrate is sequentially heat-treated in the arrangement order, whereby one heat treatment as a whole is dividedly and successively performed in the plurality of heat treatment units. This allows substrates to be heat-treated along the same route and uniforms the thermal history among the substrates. At the time when heat-treating a plurality of substrates, the present invention causes less variation in thermal history among the substrates as compared to the case of parallel heat treatments.

2 Claims, 10 Drawing Sheets

HEAT TREATMENT APPARATUS, HEAT TREATMENT METHOD, AND COMPUTER READABLE STORAGE MEDIUM

BACKGROUND OF THE INVENTION

1. Field of the Invention

The present invention relates to a substrate heat treatment apparatus, a heat treatment method, and a computer readable storage medium storing a program when causing a computer to execute the heat treatment method.

2. Description of the Related Art

In a photolithography process in a manufacturing process of a semiconductor device, for example, a resist coating treatment of applying a resist solution, for example, onto a wafer, a heat treatment of drying the resist solution (pre-baking), exposure processing of exposing the resist film to a predetermined pattern, a heat treatment of accelerating chemical reaction in the resist film after the exposure (post-exposure baking treatment), a developing treatment of developing the exposed resist film, a heat treatment of heating the wafer after the developing treatment (post baking), and so on are performed in order, to thereby form a predetermined resist pattern on the wafer.

A series of the above-described wafer treatments is performed in a coating and developing treatment system incorporating a resist coating apparatus for performing the resist coating treatment, a developing treatment apparatus for performing the developing treatment, heat treatment apparatuses for performing the above-described various kinds of heat treatments, a transfer unit for performing transfer of the wafer between the treatment apparatuses and so on.

A plurality of the above-described heat treatment apparatuses are installed for each predetermined object in the coating and developing treatment system in order to improve the throughput, so that the plurality of heat treatment apparatuses are used to heat-treat a plurality of substrates in parallel during the same time (Japanese Patent Application Laid-open No. 2001-85323).

However, where a plurality of wafers are treated in parallel by the plurality of heat treatment apparatuses as described above, there are individual differences between the heat treatment apparatuses, thus causing variation in thermal history of the wafer depending on the heat treatment apparatus for treatment. In addition, the transfer route and the transfer time of the wafer vary depending on the installation position of each heat treatment apparatus, thus also causing a difference in total thermal history of the wafer. The thermal history affects the dimension of the finally formed resist pattern and may cause variation in the dimension of the resist pattern among the wafers in the case of the above-described parallel treatment.

SUMMARY OF THE INVENTION

The present invention has been developed in consideration of the above viewpoints, and its object is to uniform the thermal history of a substrate such as a wafer by a heat treatment so as to suppress variation in treatment result such as the dimension of a resist pattern among the substrates.

The present invention to achieve the above object is a heat treatment apparatus for performing a predetermined heat treatment for a substrate, including a plurality of heat treatment units for dividedly performing the predetermined heat treatment; and a substrate transfer mechanism for transferring the substrate to the plurality of heat treatment units in a predetermined order, and capable of successively transferring a plurality of substrates in the plurality of heat treatment units.

According to the present invention, the substrate can be transferred to the plurality of heat treatment units for dividedly performing the predetermined heat treatment, in a predetermined order, so that all of the substrates can be heat-treated through the same route. As a result, the thermal history of the substrates can be uniform to make the treatment result uniform. Further, since a plurality of substrates can be successively transferred to the plurality of heat treatment units, the plurality of substrates can be treated during the same time in the heat treatment apparatus, thus eliminating a decrease in throughput.

A plurality of heat treatment plates may be arranged in a linear form in the horizontal direction, and the substrate transfer mechanism may have a transfer member moving along an arrangement direction of the heat treatment plates while supporting the substrate to transfer the substrate between the heat treatment plates. The transfer member may be provided for each zone between adjacent heat treatment plates. The transfer member may be different in position within the substrate to support the substrate for each zone between the adjacent heat treatment plates.

The plurality of heat treatment plates may be provided side by side in a linear form on a horizontal base, the base may have a groove formed thereon along the arrangement direction of the heat treatment plates and passing through the heat treatment plates, and the transfer member may include a slider portion moving in the groove and a pin portion provided at the slider portion for supporting a lower surface of the substrate and raising and lowering the substrate.

The transfer member may have a plurality of wire portions formed along a direction perpendicular to the arrangement direction of the heat treatment plates for supporting a lower surface of the substrate, a horizontal drive portion for moving the wire portion in the arrangement direction of the heat treatment plates, and a raising and lowering portion for raising and lowering the wire portion.

Each of the heat treatment plates may be provided with a raising and lowering pin for raising and lowering the substrate, and the plurality of wire portions may be capable of opening/closing right and left to allow the substrate supported on the raising and lowering pin to pass therebetween in the vertical direction.

Each of the plurality of heat treatment plates may be divided into a plurality of regions so that the temperature may be controllable for each region of the each heat treatment plate. Further, the temperature of each region of each heat treatment plate may be controlled so that a thermal history of the substrate transferred to all of the heat treatment plates becomes uniform within the substrate. Furthermore, at least one of the plurality of heat treatment plates may be different in division pattern of the regions.

The present invention according to another aspect is a heat treatment method of performing a predetermined heat treatment for a substrate, including the step of sequentially transferring the substrate in a predetermined order to a plurality of heat treatment units for dividedly performing the predetermined heat treatment at the same temperature to thereby perform the predetermined heat treatment.

The heat treatment method is performed, for example, using a heat treatment apparatus and, at that time, the heat treatment method may be programmed in a computer readable storage medium in a control unit for controlling the heat treatment apparatus.

According to the present invention, the thermal history of the substrates can be uniform to stabilize the treatment result of the substrates, resulting in improved yields.

DETAILED DESCRIPTION OF THE INVENTION

Figure 1:
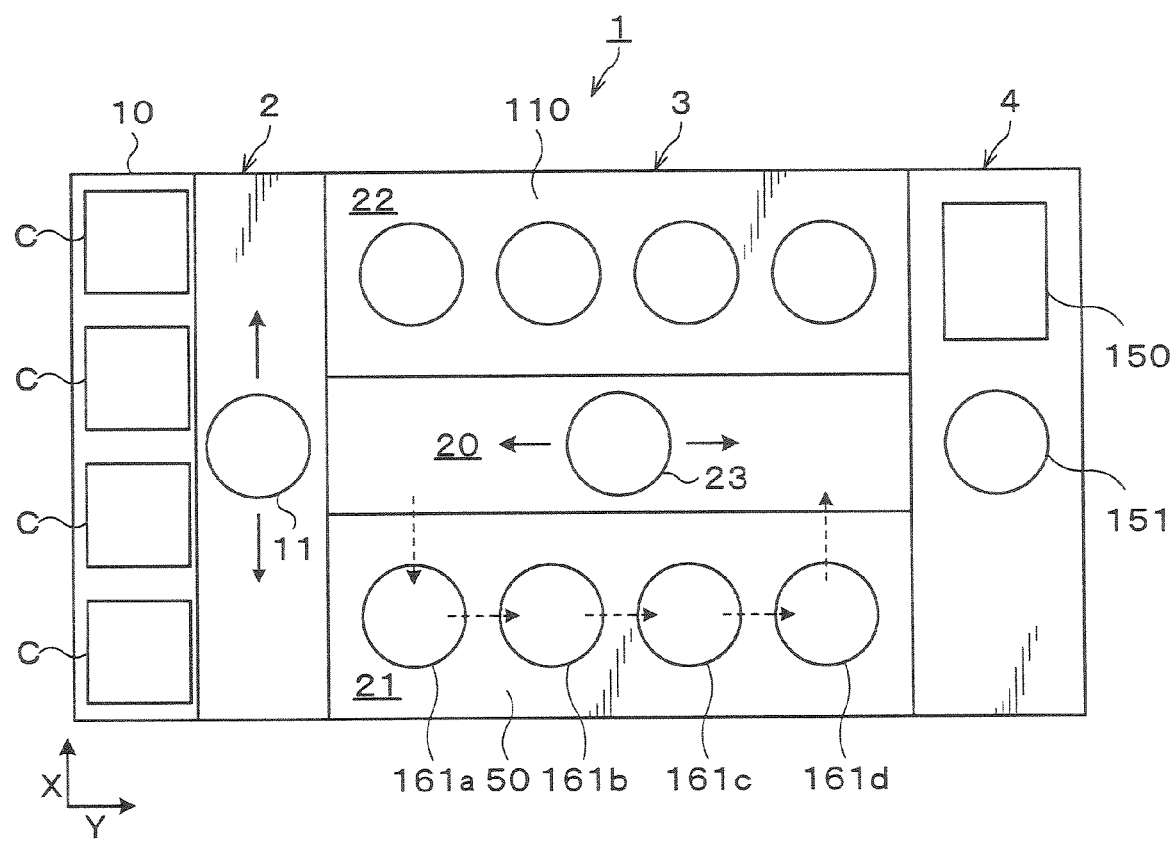
FIG. 1 is a plan view showing the outline of a configuration of a coating and developing treatment system incorporating a heat treatment apparatus according to the present embodiment.
Figure 2:
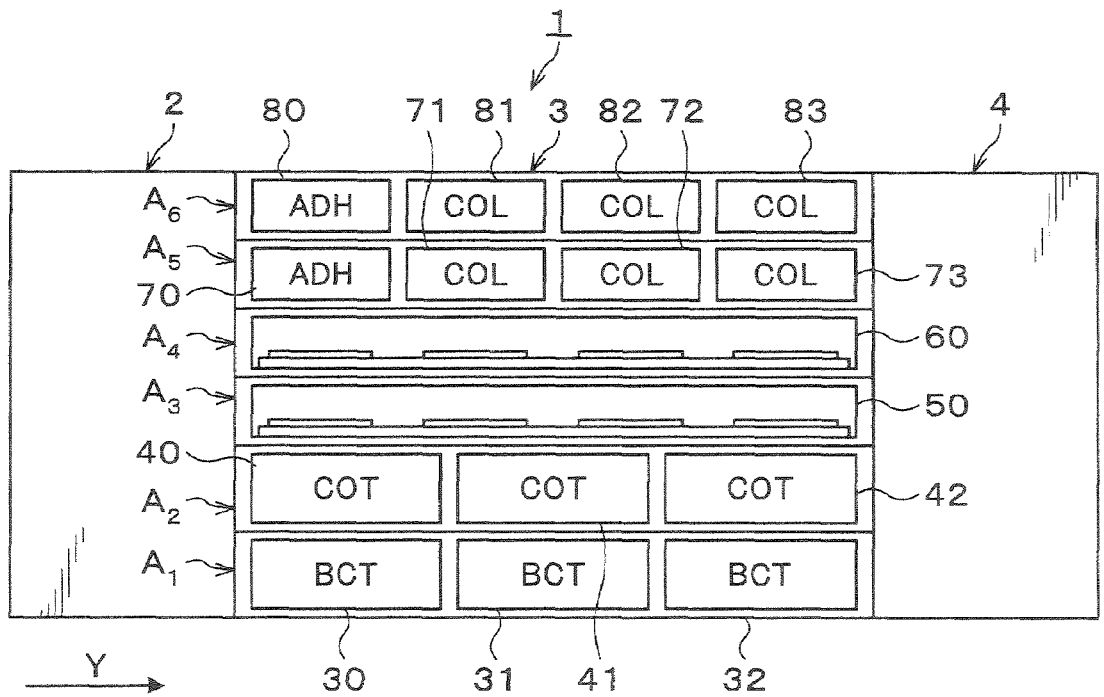
FIG. 2 is a front view of the coating and developing treatment system.
Figure 3:
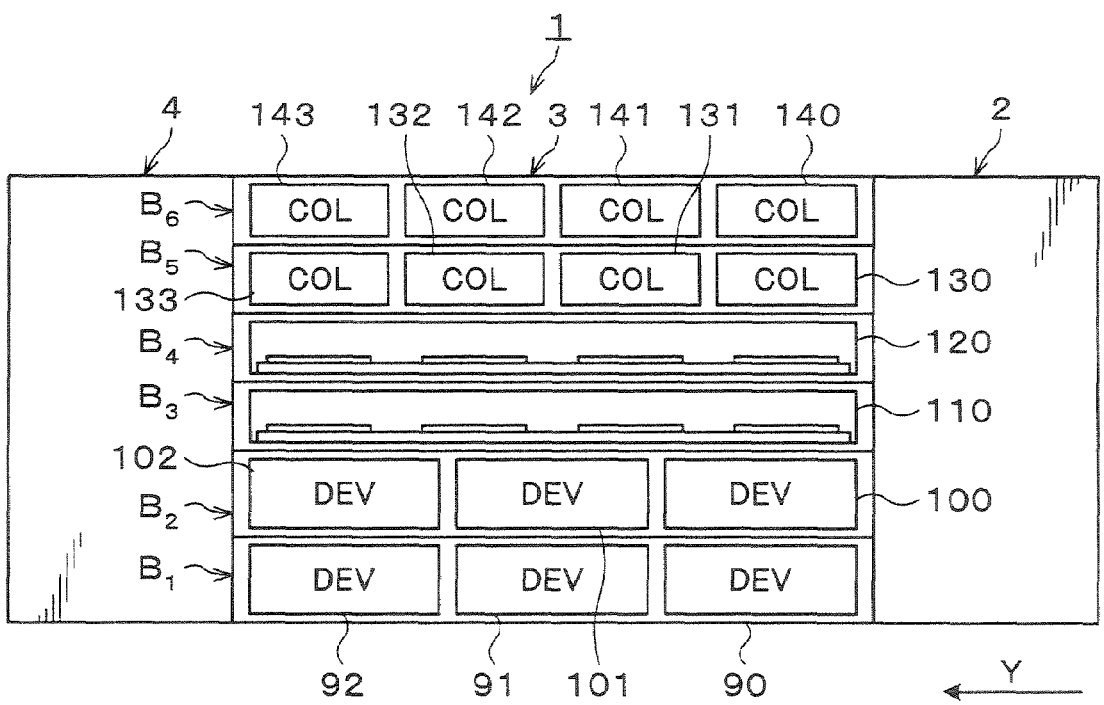
FIG. 3 is a rear view of the coating and developing treatment system.

Hereinafter, a preferred embodiment of the present invention will be described. FIG. 1 is a plan view showing the outline of a configuration of a coating and developing treatment system 1 incorporating a heat treatment apparatus according to the present embodiment, FIG. 2 is a front view of the coating and developing treatment system 1 and FIG. 3 is a rear view of the coating and developing treatment system 1.

The coating and developing treatment system 1 has, as shown in FIG. 1, a configuration in which, for example, a cassette station 2 for transferring a plurality of wafers W per cassette as a unit from/to the outside into/from the coating and developing treatment system 1 and transferring the wafers W into/out of a cassette C; a treatment station 3 including a plurality of various kinds of treatment apparatuses, which are multi-tiered, for performing various kinds of treatments in a photolithography process; and an interface station 4 for passing the wafer W to/from a not-shown aligner provided adjacent to the treatment station 3, are integrally connected.

In the cassette station 2, a cassette mounting table 10 is provided which mounts a plurality of cassettes C thereon. In the cassette station 2, a wafer transfer body 11 is further provided which transfers the wafer W, for example, between the cassette C and a later-described main transfer unit 23 in the treatment station 3.

In the treatment station 3, a transfer section 20 is formed extending in a Y-direction (in a left-to-right direction in FIG. 1) at the middle portion. Two treatment sections 21 and 22 are arranged on both sides in an X-direction (a top-to-bottom direction in FIG. 1) of the transfer section 20. In the transfer section 20, the main transfer unit 23 movable in the Y-direction is provided and can transfer the wafer W between arbitrary treatment apparatuses in the later-described first and second treatment sections 21 and 22. The main transfer unit 23 can also transfer the wafer W from/to various kinds of treatment apparatuses in the first and second treatment sections 21 and 22 to/from the wafer transfer body 11 in the cassette station 2 and a later-described wafer transfer body 151 in the interface station 4.

The first treatment section 21 is provided on the front side being the negative direction side in the X-direction (the downward direction in FIG. 1) in the treatment station 3. The first treatment section 21 has, for example, a vertically six-tiered structure as shown in FIG. 2, a single treatment apparatus or a plurality of treatment apparatuses being mounted on each tier. For example, on a first tier A1 being the lowermost tier, three bottom coating apparatuses 30, 31 and 32 each for forming an anti-reflection film to prevent reflection of light at the time of exposure processing are provided in order from the cassette station 2 side toward the interface station 4 side (the positive direction side in the Y-direction). On a second tier A2, three resist coating apparatuses 40, 41, and 42 each for applying a resist solution to the wafer W are provided in order toward the positive direction side in the Y-direction.

On a third tier A3 and a fourth tier A4, heat treatment apparatuses 50 and 60 according to the present invention are provided. On a fifth tier A5, for example, an adhesion apparatus 70 for performing hydrophobic treatment on the wafer W and three cooling apparatuses 71, 72, and 73 each for cooling the wafer W are provided in order toward the positive direction side in the Y-direction. On a sixth tier A6, for example, an adhesion apparatus 80 and cooling apparatuses 81, 82, and 83 are provided, as in the fifth tier A5, in order toward the positive direction side in the Y-direction.

The second treatment section 22 is provided on the rear side being the positive direction side in the X-direction (the upward direction in FIG. 1) in the treatment station 3. The second treatment section 22 has, for example, a vertically six-tiered structure as in the first treatment section 21 as shown in FIG. 3, a single treatment apparatus or a plurality of treatment apparatuses being mounted on each tier. For example, on a first tier B1 being the lowermost tier, for example, three developing treatment apparatuses 90, 91, and 92 each for performing developing treatment on the wafer W are provided in order toward the positive direction side in the Y-direction. On a second tier B2, three developing treatment apparatuses 100, 101, and 102 are provided, for example, as in the first tier B1, in order toward the positive direction side in the Y-direction.

On a third tier B3 and a fourth tier B4, heat treatment apparatuses 110 and 120 are provided. On a fifth tier B5, for example, four cooling apparatuses 130, 131, 132, and 133 are provided in order toward the front direction side in the Y-direction. On a sixth tier B6, for example, four cooling apparatuses 140, 141, 142, and 143 are provided, as in the fifth tier B5, in order toward the positive direction side in the Y-direction.

In the interface station 4, for example, an edge exposure apparatus 150 is provided which exposes the edge portion of the wafer W to light, for example, as shown in FIG. 1. Further, at the middle portion of the interface station 4, the wafer transfer body 151 is provided which transfers the wafer W between the above-described main transfer unit 23 and the edge exposure apparatus 150 and the not-shown aligner.

Figure 4:
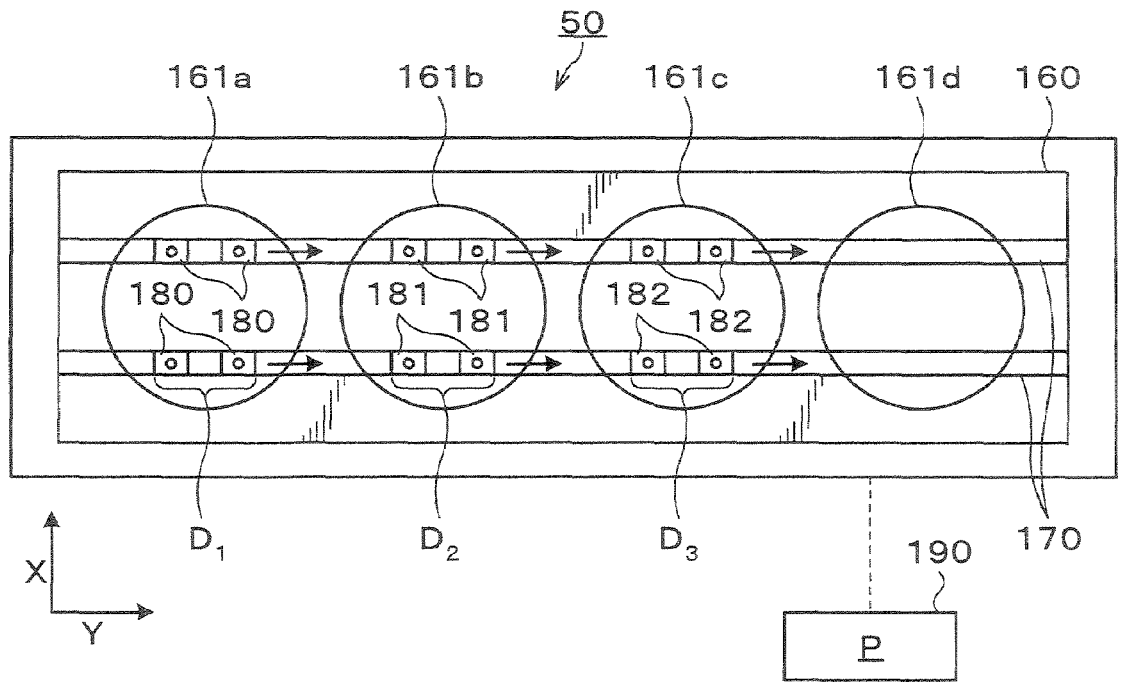
FIG. 4 is a plan view showing the outline of a configuration of the heat treatment apparatus.

Next, the configuration of the above-described heat treatment apparatus 50 will be described. The heat treatment apparatus 50 has a base 160 in a flat plate form elongated in the Y-direction as shown in FIG. 4. On the base 160, for example, four heat treatment plates 161a, 161b, 161c, and 161d as heat treatment units each for mounting and heating the wafer W thereon are provided side by side in order toward the positive direction side in the Y-direction.

Figure 5:
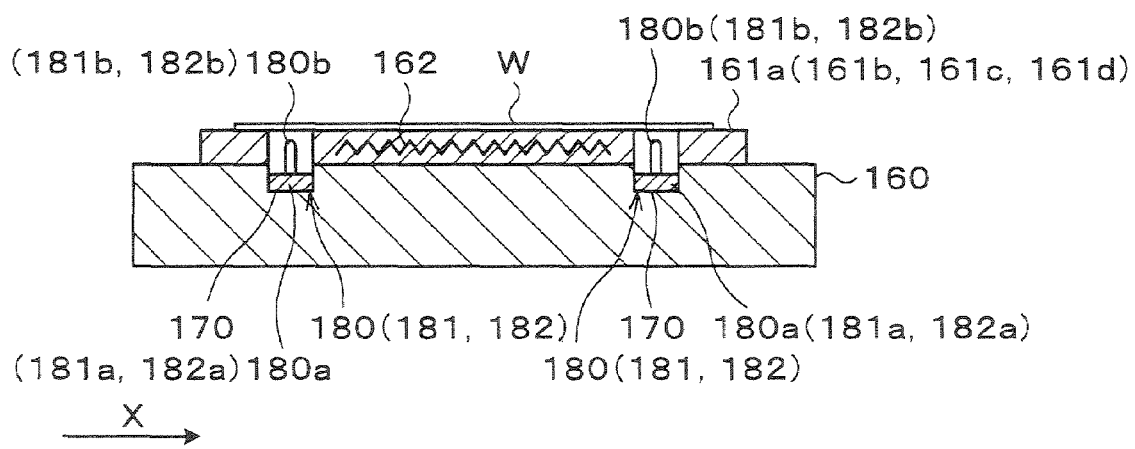
FIG. 5 is a longitudinal sectional view of a base and a heat treatment plate.

For example, the first heat treatment plate 161a is formed in a thick disk shape as shown in FIG. 5. Inside the first heat treatment plate 161a, a heater 162 is embedded which generates heat by power feeding. The heater 162 can be used to set the first heat treatment plate 161a to a predetermined temperature. The other second heat treatment plate 161b, third heat treatment plate 161c, and fourth heat treatment plate 161d have the same configuration as that of the first heat treatment plate 161a, each having a disk shape and including the heater 162 therein. Note that control of the temperature of each of the heat treatment plates 161a to 161d is conducted by, for example, a later-described control unit 190.

As shown in FIG. 4, the front surface of the base 160 is formed with two grooves 170 extending in parallel in the Y-direction. The grooves 170 are formed passing under the heat treatment plates 161a to 161d. In the grooves 170, a first transfer member group D1 for transferring the wafer W between the first heat treatment plate 161a and the second heat treatment plate 161b, a second transfer member group D2 for transferring the wafer W between the second heat treatment plate 161b and the third heat treatment plate 161c, and a third transfer member group D3 for transferring the wafer W between the third heat treatment plate 161c and the fourth heat treatment plate 16 id are provided.

Figure 6:
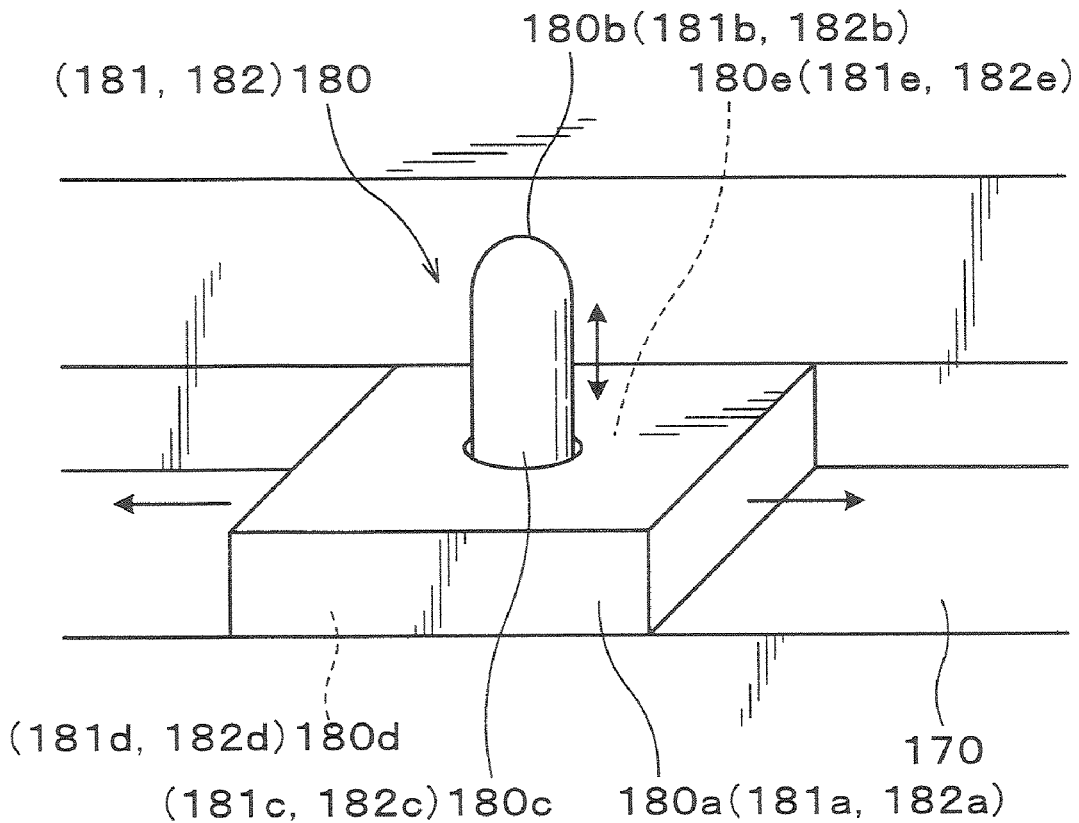
FIG. 6 is an explanatory view showing a configuration of a transfer member.

For example, the first transfer member group D1 is composed of, for example, four transfer members 180. The four transfer members 180 are arranged, two each for one groove 170. Each of the transfer members 180 includes, for example, as shown in FIG. 6, a slider portion 180a in a square flat plate form and a pin portion 180b provided at the slider portion 180a. The pin portion 180b is provided in a hole 180c formed, for example, at the center of the slider portion 180a and can be raised and lowered, for example, by a raising and lowering drive portion 180d such as a cylinder embedded in the slider portion 180a. The pin portions 180b can protrude from within the grooves 170 to positions above the heat treatment plates 161a and 161b. The slider portion 180a can horizontally move in the groove 170, for example, by means of a horizontal drive portion 180e such as an embedded motor. The transfer members 180 in the first transfer member group D1 can move the slider portions 180a in the Y-direction while supporting the wafer W by the pin portions 180b to thereby transfer the wafer W between the first heat treatment plate 161a and the second heat treatment plate 161b.

The second transfer member group D2 and the third transfer member group D3 have the same configuration as that of the above-described first transfer member group D1. The second transfer member group D2 is composed of four transfer members 181, each of the transfer members 181 having a slider portion 181a, a pin portion 181b, a hole 181c, a raising and lowering drive portion 181d, and a horizontal drive portion 181e. The third transfer member group D3 is composed of four transfer members 182, each of the transfer members 182 having a slider portion 182a, a pin portion 182b, a hole 182c, a raising and lowering drive portion 182d, and a horizontal drive portion 181e. Note that the first to third transfer member groups D1 to D3 constitute a substrate transfer mechanism in this embodiment.

The control of the heat treatment conducted in the heat treatment apparatus 50 is performed, for example, by the control unit 190 shown in FIG. 4. The control unit 190 is, for example, a computer and has a program storage unit. The program storage unit stores a program P to control the operations of the heaters 162 in the heat treatment plates 161a to 161d and the transfer members 180 to 182 so as to execute the heat treatment following a predetermined recipe. Note that the program P may be recorded on a computer readable recording medium, such as a hard disk, a compact disk, an MO or the like, and installed from the recording medium into the control unit 190.

Note that the heat treatment apparatuses 60, 110, and 120 have the same configuration as that of the above-described heat treatment apparatus 50 in this embodiment and therefore their description will be omitted.

Next, the heat treatment process in the heat treatment apparatus 50 configured as described above will be described together with the photolithography process performed in the coating and developing treatment system 1.

First of all, a plurality of wafers W are successively taken out of the cassette C on the cassette mounting table 10 and delivered to the main transfer unit 23 in the treatment station 3 by the wafer transfer body 11. Each of the wafers W is transferred by the main transfer unit 23, for example, to the adhesion apparatus 80 on the sixth tier A6 in the first treatment section 21 where the wafer W is subjected to hydrophobic treatment, and then transferred to the cooling apparatus 81 and cooled there. The wafer W is then transferred, for example, to the resist coating apparatus 40 on the second tier A2 where a resist film is formed on the wafer W. The wafers W with the resist film formed thereon are transferred one by one by the main transfer unit 23 to the heat treatment apparatus 50 on the third tier A3 where the wafer W is subjected to heat treatment (pre-baking treatment). In this embodiment, the heat treatment in the heat treatment apparatus 50 shall perform heating for the wafer W at a set temperature of T° C. for S seconds.

Figure 7:
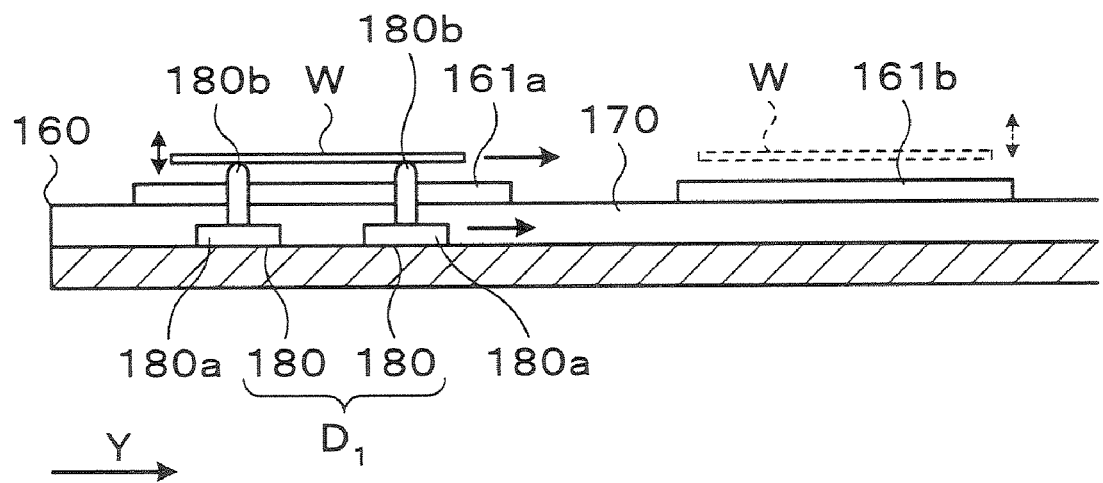
FIG. 7 is a longitudinal sectional view of a base for explaining transfer of a wafer from a first heat treatment plate to a second heat treatment plate.

The wafers W are transferred one by one by the main transfer unit 23, for example, to the first heat treatment plate 161a lying on the negative direction side in the Y-direction in the heat treatment apparatus 50 as shown in FIG. 1. The wafer W is first delivered from the main transfer unit 23 to the pin portions 180b of the transfer members 180 in the first transfer member group D1 which have been previously raised and waiting as shown in FIG. 7. The pin portions 180b are then lowered so that the wafer W is mounted on the first heat treatment plate 161a which is temperature-set at T° C. The wafer W is heated on the first heat treatment plate 161a, for example, for S/4 seconds. At the conclusion of the heating time, the pin portions 180b are raised to lift the wafer W from the first heat treatment plate 161a. Subsequently, the slider portions 180a of the transfer members 180 are moved to the positive direction side in the Y-direction to move the wafer W to a position above the second heat treatment plate 161b (shown by a dotted line in FIG. 7). When the slider portions 180*a* are moved the positions under the second heat treatment plate 161*b*, the pin portions 180*b* are lowered so that the wafer W is mounted on the second heat treatment plate 161*b* which is temperature-set at T° C.

The wafer W mounted on the second heat treatment plate 161*b* is heated here also for S/4 seconds. During this time, the first transfer members 180 of the first transfer member group D1 are returned to their initial positions at the first heat treatment plate 161*a* and wait to receive the next wafer W. Further, the transfer members 181 of the second transfer member group D2 are moved to the positions at the second heat treatment plate 161*b* and wait there.

Figure 8:
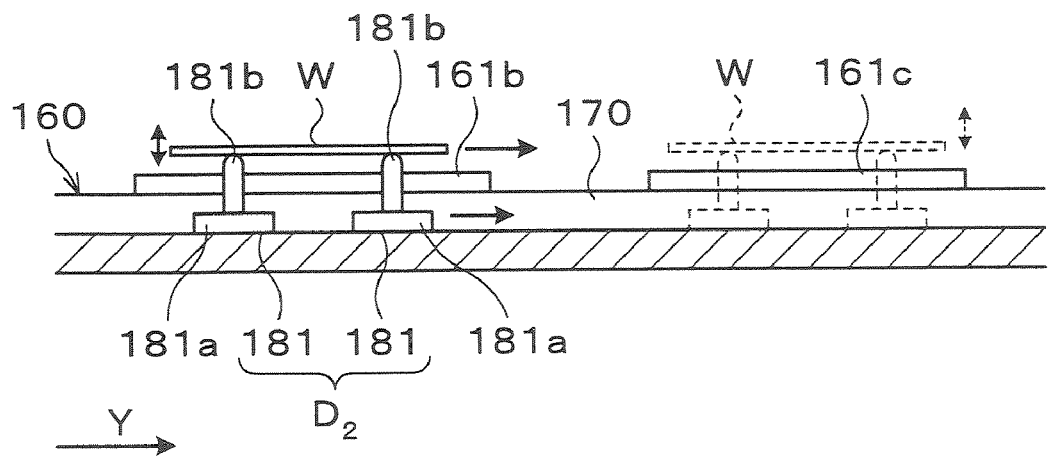
FIG. 8 is a longitudinal sectional view of the base for explaining transfer of the wafer from the second heat treatment plate to a third heat treatment plate.

The wafer W on the second heat treatment plate 161*b* is then lifted by the pin portions 181*b* of the transfer members 181 as shown in FIG. 8. Subsequently, the slider portions 181*a* are moved to the positive direction side in the Y-direction to move the wafer W to a position above the third heat treatment plate 161*c*. The pin portions 181*b* are lowered so that the wafer W is mounted on the third heat treatment plate 161*c* which is temperature-set at T° C.

The wafer W mounted on the third heat treatment plate 161*c* is heated for S/4 seconds. During this time, for example, the second transfer members 181 of the second transfer member group D2 are returned to their original positions at the second heat treatment plate 161*b* and wait to receive the next wafer W. Further, the transfer members 182 of the third transfer member group D3 are moved to the positions at the third heat treatment plate 161*c* and wait there.

Figure 9:
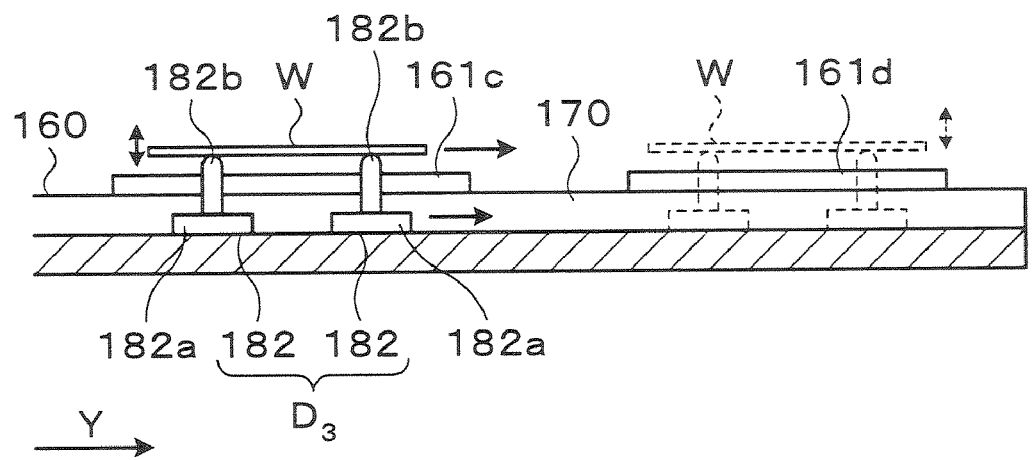
FIG. 9 is a longitudinal sectional view of the base for explaining transfer of the wafer from the third heat treatment plate to a fourth heat treatment plate.

The wafer W on the third heat treatment plate 161*c* is then lifted by the pin portions 182*b* of the transfer members 182 as shown in FIG. 9. Subsequently the slider portions 182*a* are moved to the positive direction side in the Y-direction to move the wafer W to a position above the fourth heat treatment plate 161*d*. The pin portions 182*b* are lowered so that the wafer W is mounted on the fourth heat treatment plate 161*d* which is temperature-set at T° C., and heated for S/4 seconds.

After completion of the heating by the fourth heat treatment plate 161*d* the wafer W is lifted by the pins portions 182*b* of the transfer members 182 and delivered to the main transfer unit 23. The wafer W is then transferred out of the heat treatment apparatus 50, with which the pre-baking treatment at T° C. for S seconds in total for the wafer W ends. Into the heat treatment apparatus 50, the wafers W are successively inserted, and those wafers W are successively transferred to the heat treatment plates 161*a* to 161*d*. As described above, a plurality of wafers W are successively treated during the same time in the heat treatment apparatus 50.

The wafer W for which the pre-baking treatment has been completed is transferred by the main transfer unit 23, for example, to the cooling apparatus 82 on the sixth tier A6 and cooled there. The wafer W is then delivered to the wafer transfer body 151 in the interface station 4, subjected to edge exposure processing in the edge exposure apparatus 150, and then transferred to the aligner. The wafer W for which the exposure processing in the aligner has been completed is returned by the wafer transfer body 151 into the treatment station 3, and transferred by the main transfer unit 23 for example, to the heat treatment apparatus 110 on the third tier B3 in the second treatment section 22. In the heat treatment apparatus 110, a plurality of wafers W are transferred one by one to the four heat treatment plates, as in the above-described heat treatment apparatus 50, where the wafers W are subjected to a predetermined heat treatment (post-exposure baking treatment).

The wafer W for which the post-exposure baking treatment has been completed is transferred by the main transfer unit 23, for example, to the cooling apparatus 140 on the sixth tier B6 and cooled there, and the wafer W is then transferred, for example, to the developing treatment apparatus 100 on the second tier B2 where it is subjected to developing treatment. The wafer W for which the developing treatment has been completed is transferred to the heat treatment apparatus 120 on the fourth tier B4, where a plurality of wafers W are transferred one by one to the four heat treatment plates, as in the above-described heat treatment apparatus 50, where the wafers W are subjected to a predetermined heat treatment (post-baking treatment).

The wafer W is then transferred by the main transfer unit 23, for example, to the cooling apparatus 130 on the fifth tier B5 and cooled there, and the wafer W is then delivered by the main transfer unit 23 to the wafer transfer body 11 in the cassette station 2. The wafer W is then returned by the wafer transfer body 11 into the cassette C, with which a series of wafer treatments for forming a resist pattern ends.

According to the above embodiment, the plurality of heat treatment plates 161*a* to 161*d* and the plurality of transfer member groups D1 to D3 for transferring the wafer W between heat treatment plates are provided in the heat treatment apparatus 50, so that a plurality of wafers W can be transferred one by one to the heat treatment plates 161*a* to 161*d* at the same temperature where a predetermined heat treatment can be dividedly performed for the wafer W. As a result, every wafer W can be subjected to the heat treatment through the same route, thus preventing variation in thermal history among wafers. Further, since the plurality of wafers W are treated during the same time in the heat treatment apparatus 50, a decrease in throughput due to a heat treatment performed in series can be also prevented.

Since the transfer members 180 to 182 moving along the arrangement direction of the heat treatment plates 161*a* to 161*d* while supporting the wafer W are provided in the respective transfer member groups D1 to D3, the transfer of the wafer W between the heat treatment plates can be appropriately performed. Further, since the transfer members 180 to 182 are provided in respective zones between the four heat treatment plates 161*a* to 161*d*, the transfer of the wafer W between the zones can be independently performed, thereby efficiently performing the transfer of the wafer W.

Further, since the two grooves 170 along the arrangement direction of the heat treatment plates 161*a* to 161*d* are formed on the base 160, and the transfer members 180 to 182 include the slider portions 180*a* to 182*a* moving in the grooves 170 and the pin portions 180*b* to 182*b* which can freely raise and lower the wafer W, the wafer W mounted on one of the heat treatment plates can be raised and supported, moved to a position above the next heat treatment plate, and then lowered and mounted on the next heat treatment plate. As described above, the transfer of the wafer W between the heat treatment plates 161*a* to 161*d* can be suitably performed.

Figure 10:
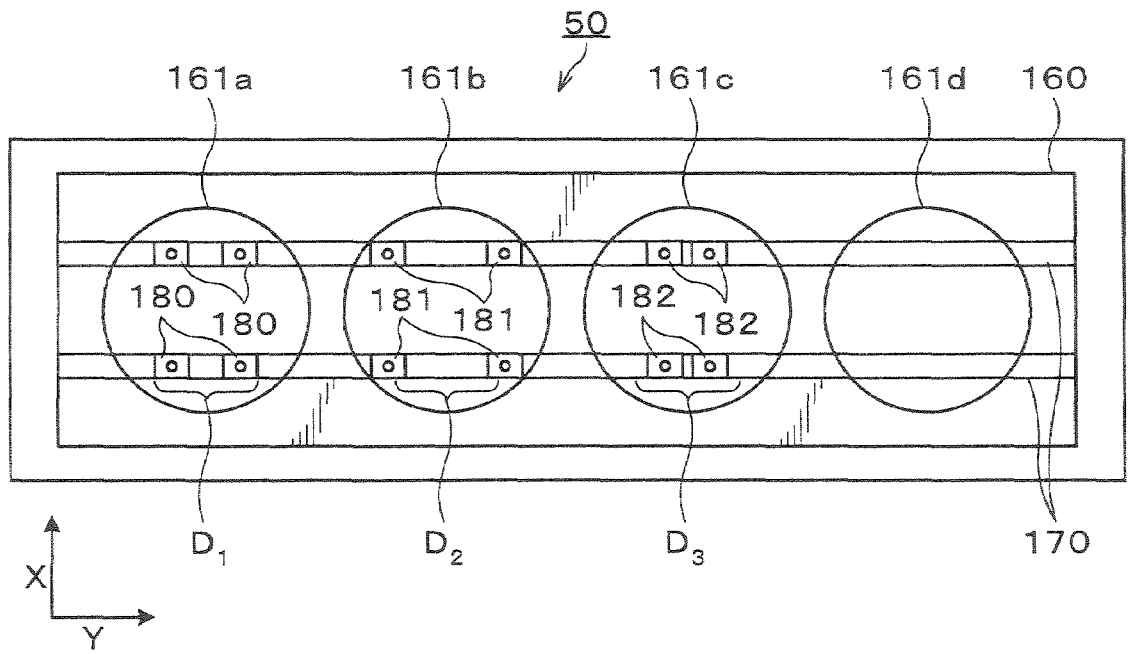
FIG. 10 is a plan view of the heat treatment apparatus in the case in which the positions of the transfer members are changed.

While the transfer members 180 to 182 of the transfer member groups D1 to D3 support the same position within the wafer in the above embodiment, the transfer members 180, 181, and 182 may support different positions within the wafer. For example, as shown in FIG. 10, the transfer members 181 of the second transfer member group D2 support positions closer to the outer periphery of the wafer W than those supported by the transfer members 180 of the first transfer member group D1, and the transfer members 182 of the third transfer member group D3 support positions closer to the center of the wafer W than those supported by the transfer members 180 of the first transfer member group D1. With this arrangement, the contact position between the wafer W and each of the transfer members 180, 181 and 182 can be changed when the wafer W passes along and is heated by the four heat treatment plates 161a to 161d, thereby preventing a decrease in temperature of a part of the wafer W due to a contact with the transfer members 180 to 182 to prevent variation in temperature within the wafer. As a result, the heat treatment of the wafer W is uniformly performed within the wafer.

Figure 11:
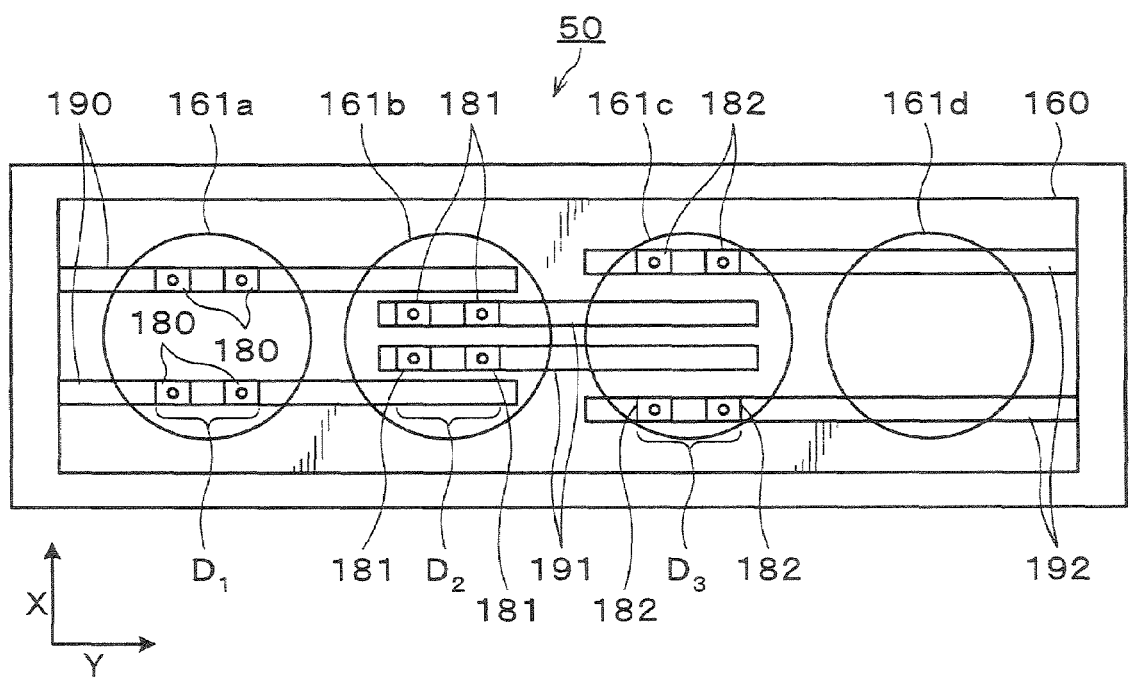
FIG. 11 is a plan view of the heat treatment apparatus in which a plurality of grooves are provided.

Further, grooves 190, 191, and 192, which are different in position in the X-direction on the base 160, may be provided two each in respective zones between the four heat treatment plates 161a to 161d as shown in FIG. 11, and the transfer members 180, 181, and 182 may be provided in the grooves 190, 191 and 192, respectively. This also makes it possible to shift the position where each of the transfer members 180 to 182 supports the wafer W.

Figure 12:
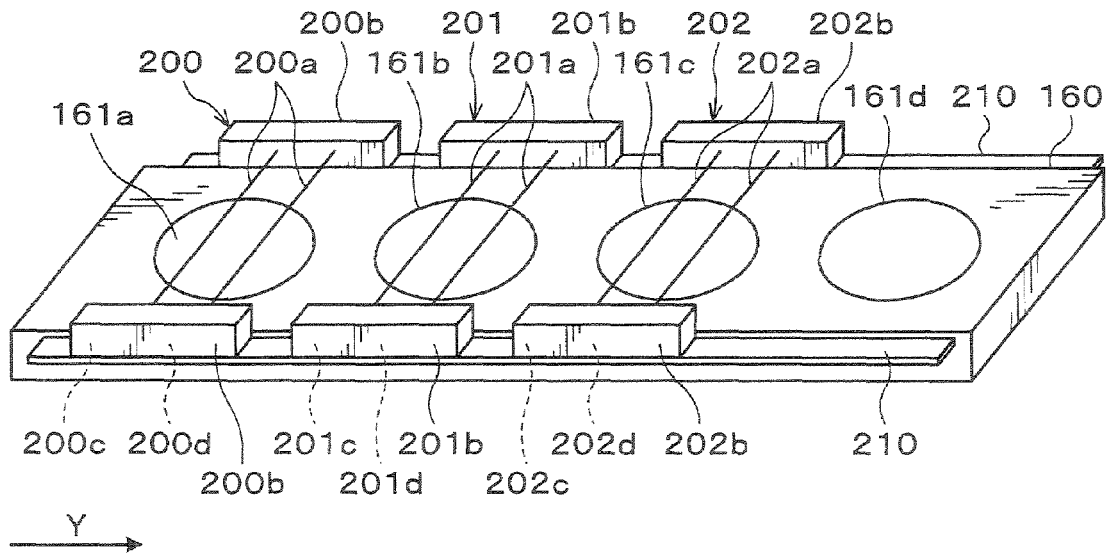
FIG. 12 is a perspective view of the inside of the heat treatment apparatus in the case using transfer members having wire portions.

While the transfer members 180 to 182 are configured to support the wafer W using their pin portions in the above embodiment, the wafer W may be supported by a plurality of wire portions. In this case, transfer members 200, 201 and 202 each having wire portions are provided, for example, in respective zones between the four heat treatment plates 161a to 161d as shown in FIG. 12. The first transfer member 200 includes two wire portions 200a formed along the X-direction above the base 160 and holding portions 200b for holding end portions of the wire portions 200a on both side surfaces of the base 160. For example, the holding portion 200b can be raised and lowered, for example, by a raising and lowering drive portion 200c such as a cylinder provided therein. The holding portion 200b is provided on a rail 210 formed in the Y-direction, for example, on the side surface of the base 160 and can be moved on the rail 210, for example, by a horizontal drive portion 200d such as a motor provided in the holding portion 200b.

Figure 13:
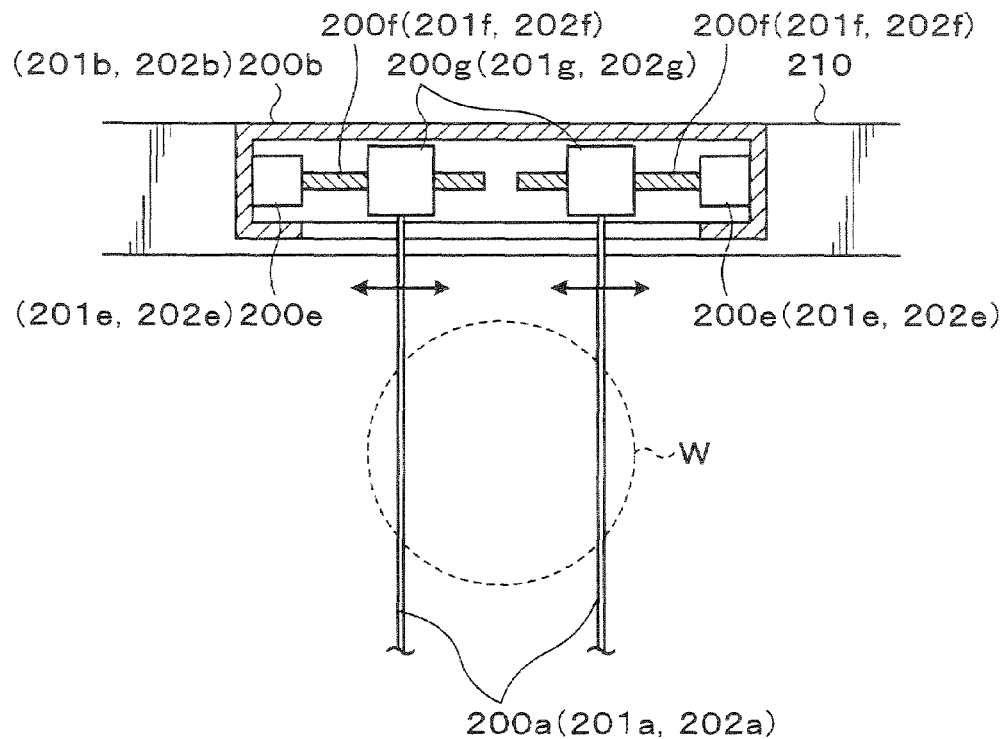
FIG. 13 is an explanatory view of a transverse section showing a configuration inside a holding portion of the transfer member.

Inside the holding portion 200b, for example, two movable bodies 200g moving in the Y-direction on guide shafts 200f by means of motors 200e, for example, as shown in FIG. 13. The movable bodies 200g hold the wire portions 200a one each. This arrangement allows the two wire portions 200a to open/close right and left, so that the two wire portions 200a open to allow the wafer W to pass through the space therebetween in the vertical direction.

The other second transfer member 201 and third transfer member 202 have the same configuration as that of the first transfer member 200. For example, the second transfer member 201 includes wire portions 201a, holding portions 201b, raising and lowering drive portions 201c, horizontal drive portions 201d, motors 201e, guide shafts 201f, and movable bodies 201g. The third transfer member 202 includes wire portions 202a, holding portions 202b, raising and lowering drive portions 202c, horizontal drive portions 202d, motors 202e, guide shafts 202f, and movable bodies 202g.

Figure 14:
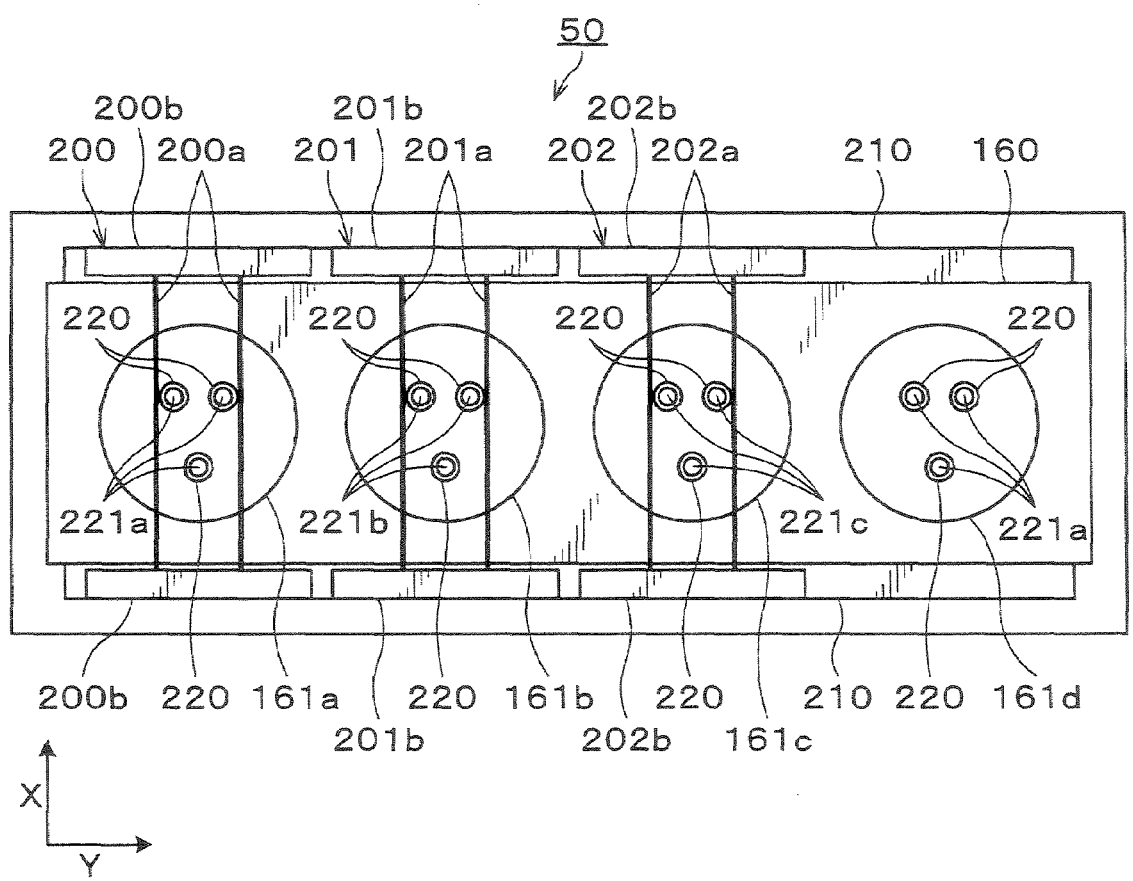
FIG. 14 is a plan view of the heat treatment apparatus.

At the middle portions of the heat treatment plates 161a to 161d, as shown in FIG. 14, a plurality of holes 220 are formed, in which raising and lowering pins 221a, 221b, 221c and 221d are provided, respectively, which rise and lower the wafer W while supporting it.

Figure 15:
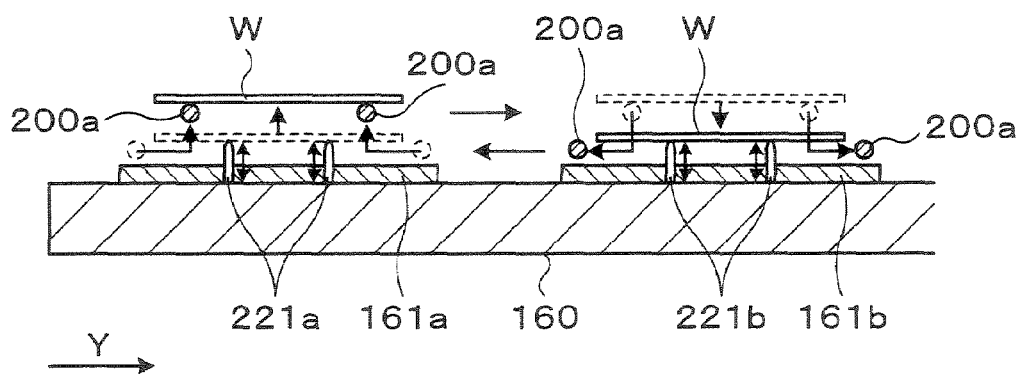
FIG. 15 is a longitudinal sectional view of the base and the heat treatment plate for explaining transfer of the wafer from the first heat treatment plate to the second heat treatment plate.

When performing the heat treatment, the wafer W is first delivered from the main transfer unit 23 to the raising and lowering pins 221a of the first heat treatment plate 161a which have been previously raised and waiting, and mounted on the first heat treatment plate 161a by the raising and lowering pins 221a. In this event, the two wire portions 200a of the first transfer member 200 are opened wider than the diameter of the wafer W above the first heat treatment plate 161a as shown in FIG. 15 (the positions of the wire portions 200a in this event are shown by dotted lines above the first heat treatment plate 161a in FIG. 15).

After completion of the heating on the first heat treatment plate 161a, the wafer W is lifted by the raising and lowering pins 221a. Thereafter, the spacing between the two wire portions 200a is reduced so that the wire portions 200a are located on the lower surface side of the wafer W. In this state, for example, the wire portions 200a are raised so the wafer W is supported on the wire portions 200a (the positions of the wire portions 200a at this time are shown by solid lines above the heat treatment plate 161a in FIG. 15). When the wafer W is supported on the wire portions 200a, the holding portions 200b are moved in the Y-direction to move the wafer W to a position above the second heat treatment plate 161b (the positions of the wire portions 200a at this time are shown by dotted lines above the heat treatment plate 161b in FIG. 15).

Subsequently, for example, the wire portions 200a are lowered so that the wafer W is supported on the raising and lowering pins 221b which have been previously raised and waiting. Thereafter, the two wire portions 200a are separated again to retract to the outside of the wafer W (the positions of the wire portions 200a at this time are shown by solid lines above the heat treatment plate 161b in FIG. 15). The raising and lowering pins 221b are then lowered to mount the wafer W on the second heat treatment plate 161b. The wire portions 200a are returned from above the second heat treatment plate 161b to above the first heat treatment plate 161a and wait to transfer the next wafer W.

The wafer W mounted on the second heat treatment plate 161b is heated for a predetermined time and then lifted by the raising and lowering pins 221b. Thereafter, similarly to the above-described transfer of the wafer W by the first transfer members 200, the wafer W is delivered to the wire portions 201a of the second transfer members 201, transferred to a position above the third heat treatment plate 161c and delivered to the raising and lowering pins 221c of the third heat treatment plate 161c. The wafer W is then mounted on the third heat treatment plate 161c by the raising and lowering pins 221c and heated.

Thereafter, the wafer W is similarly transferred to a position above the fourth heat treatment plate 161d by the raising and lowering pins 221c and the third transfer members 202 and delivered to the raising and lowering pins 221d of the fourth heat treatment plate 161d. The wafer W is then mounted on the fourth heat treatment plate 161d by the raising and lowering pins 221d and heated. The wafer W for which the heating has been completed is delivered from the raising and lowering pins 221d to the main transfer unit 23, with which a series of heat treatment steps ends.

According to this example, the transfer of the wafer W between the heat treatment plates 161a to 161d can also be appropriately performed by the transfer members 200, 201, and 202 having the wire portions. Further, since the wire portions 200a, 201a, and 202a are used to support the wafer W, the contact area between the wire portions and the wafer W can be small to prevent non-uniformity in temperature within the wafer due to thermal influence by the transfer members 200, 201 and 202.

In the example using the above-described transfer members 200 to 202 having the wire portions, the positions to support the wafer W of the transfer members 200, 201 and 202 may be changed from each other. In this case, the respective distances between the two wire portions 200a, 200a, and 202a may be changed to change their positions in contact with the wafer W. This arrangement can prevent variation in temperature within the wafer due to the thermal influence by the transfer members 200 to 202, resulting in uniform heating of the wafer W.

Figure 16:
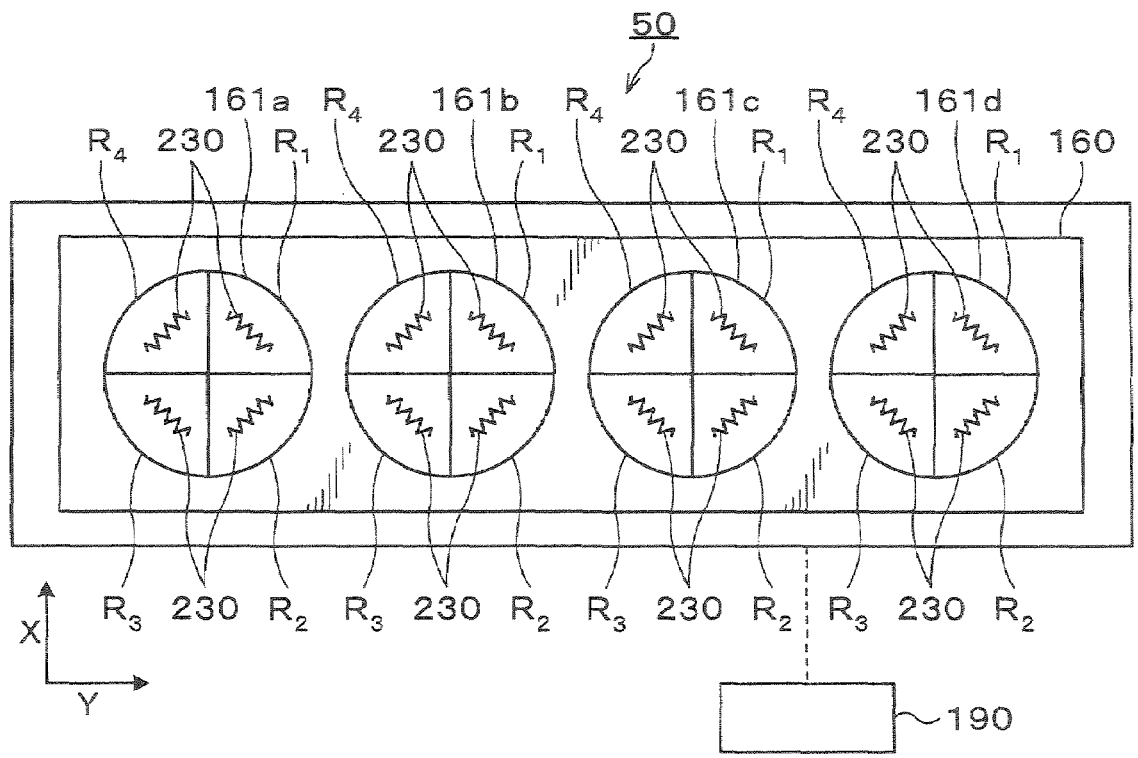
FIG. 16 is a schematic view of the heat treatment apparatus in the case in which the heat treatment plate is divided.

Each of the heat treatment plates 161a to 161d described in the above embodiment may be divided into a plurality of regions so that the temperature control may be conducted for each of the regions of each of the heat treatment plates 161a to 161d. FIG. 16 shows such an example, in which, for example, each of the heat treatment plates 161a to 161d is divided radially in radial directions into four regions R1, R2, R3 and R4, and a discrete heater 230 is provided for each of the regions R1 to R4. All of the heaters 230 in the regions R1 to R4 of each of the heat treatment plates 161a to 161d are separately controlled, for example, by the control unit 190 so that the regions R1 to R4 of each of the heat treatment plates 161a to 161d are individually controlled in temperature. The temperature control of the heat treatment plates 161a to 161d by the control unit 190 is conducted such that the thermal history of the wafer W transferred to all of the heat treatment plates 161a to 161d is uniform within the wafer W.

In this case, temperature setting of the regions R1 to R4 of the plurality of heat treatment plates 161a to 161d can correct the non-uniformity in temperature within the wafer caused, for example, by one heat treatment plate, to even out the final thermal history, within the wafer W. As a result, the dimension of the resist pattern finally formed on the wafer W can be made uniform within the wafer.

Figure 17:
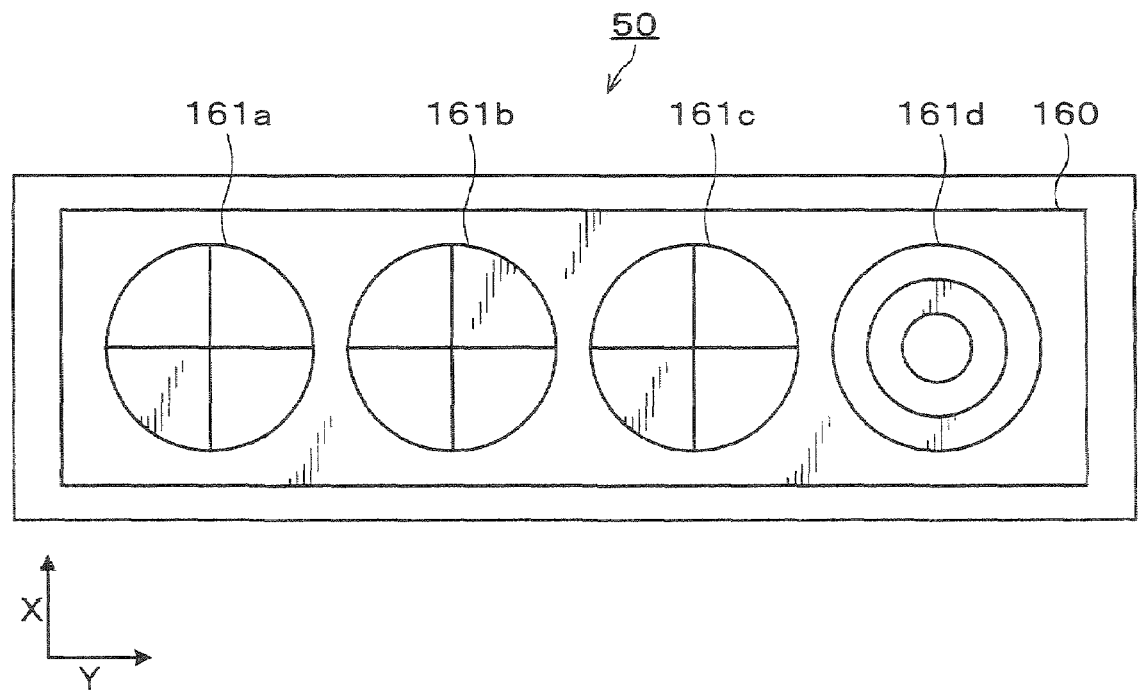
FIG. 17 is a schematic view of the heat treatment apparatus showing division patterns of the heat treatment plates.
Figure 18:
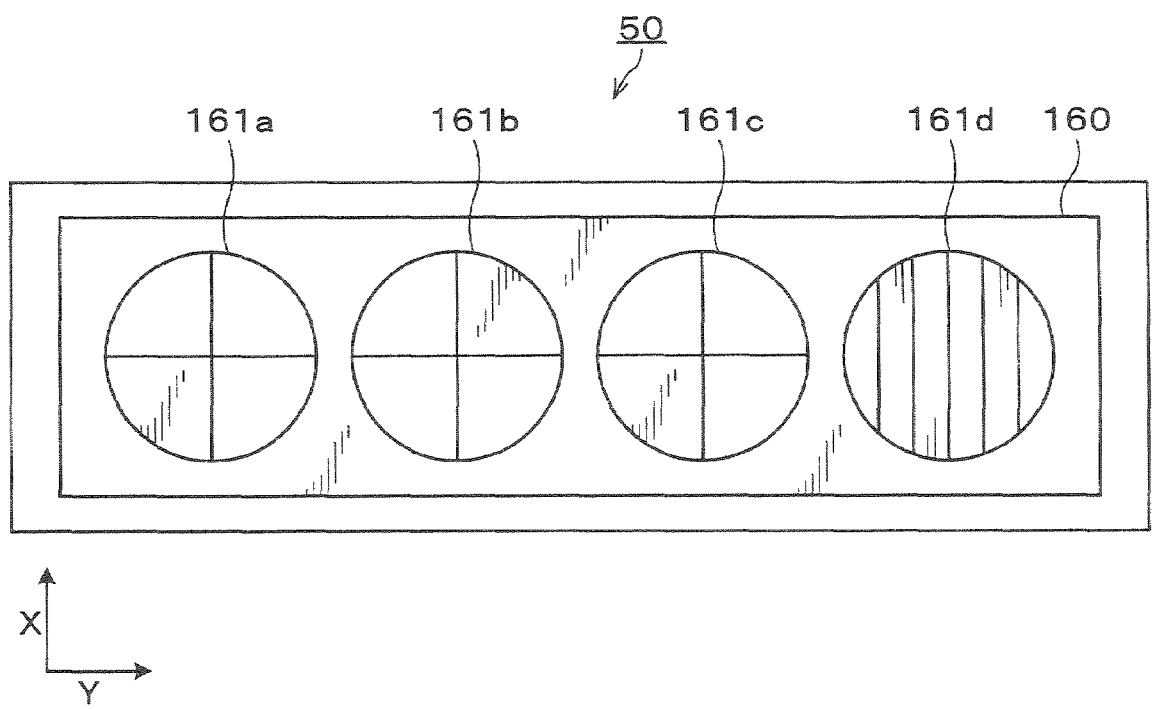
FIG. 18 is a schematic view of the heat treatment apparatus showing division patterns of the heat treatment plates.

At least one heat treatment plate of the heat treatment plates 161a to 161d may be different in division pattern. For example, when the first to third heat treatment plate 161a to 161c are radially divided as shown in FIG. 17, the fourth heat treatment plate 161d may be concentrically divided into multiple circles. Further, for example, the fourth heat treatment plate 161d may be divided by a plurality of parallel straight lines as shown in FIG. 18. Use of the heat treatment plates in the different division patterns in combination as described above allows more precise correction in temperature within the wafer so as to make the thermal history within the wafer uniform more precisely. Note that the shape of the division pattern and the combination of division patterns can be arbitrarily selected, and, for example, the division patterns of all of the heat treatment plates may be different.

A preferred embodiment of the present invention has been described above with reference to the accompanying drawings, but the present invention is not limited to the embodiment. It should be understood that various changes and modifications are readily apparent to those skilled in the art within the scope of the technical spirit as set forth in claims, and those should also be covered by the technical scope of the present invention.

While the present invention is applied to the heat treatment apparatus 50 performing the pre-baking treatment in the above embodiment, the present invention may be applied to a heat treatment apparatus performing the post-exposure baking treatment and a heat treatment apparatus performing the post-baking treatment. Further, the present invention may be applied to the heat treatment apparatuses for all of the heat treatments performed in the coating and developing treatment system 1. Further, the present invention may be applied to a heat treatment apparatus performing a heat treatment after performance of the bottom coating treatment in the coating and developing treatment system 1.

While the heat treatment apparatus 50 included the four heat treatment plates 161a to 161d, the number of treatment plates is not limited to four but can be arbitrarily selected. The present invention is not limited to the heat treatment apparatus but may be applied to the cooling apparatus performing thermal treatment for cooling. The plurality of heat treatment units are provided side by side in the horizontal direction in the present embodiment, but may be provided one above the other in the horizontal direction. The present invention may also be applied to a heat treatment apparatus for heat-treating other substrates such as an FPD (Flat Panel Display), a mask reticle for a photomask, and the like other than the wafer.

The present invention is useful in heat-treating a plurality of substrates and preventing variation in thermal history among the substrates.

What is claimed is:

1. A heat treatment apparatus for performing a predetermined heat treatment for a substrate, comprising:
    a plurality of heat treatment plates for dividedly performing the predetermined heat treatment; and
    a substrate transfer mechanism for transferring the substrate to said plurality of heat treatment plates in a predetermined order, the substrate transfer mechanism configured to successively transfer a plurality of substrates to said plurality of heat treatment plates,
    wherein said plurality of heat treatment plates are arranged side by side in a linear form in a horizontal direction, and are configured to heat-treat the substrate at the same temperature,
    wherein said substrate transfer mechanism includes a transfer member which is provided for each respective zone between adjacent heat treatment plates and which moves along an arrangement direction of said heat treatment plates in the horizontal direction while supporting the substrate to transfer the substrate between said heat treatment plates,
    wherein a position of each transfer member support relative to the substrate is different for each zone between adjacent heat treatment plates, and
    wherein said transfer member has a plurality of wire portions formed along a direction perpendicular to the arrangement direction of said heat treatment plates for supporting a lower surface of the substrate, a horizontal drive portion for moving said wire portion in the arrangement direction of said heat treatment plates, and a raising and lowering portion for raising and lowering said wire portion.

2. The heat treatment apparatus as set forth in claim 1,
    wherein each of said heat treatment plates is provided with a raising and lowering pin for raising and lowering the substrate, and
    wherein said plurality of wire portions are capable of opening/closing right and left to allow the substrate supported on said raising and lowering pin to pass therebetween in the vertical direction.

* * * * *